United States Patent
Fukuda et al.

(10) Patent No.: US 10,937,669 B2
(45) Date of Patent: Mar. 2, 2021

(54) SUBSTRATE SOLUTION-TREATMENT APPARATUS, TREATMENT SOLUTION SUPPLYING METHOD AND STORAGE MEDIUM

(71) Applicant: TOKYO ELECTRON LIMITED, Tokyo (JP)

(72) Inventors: Kosuke Fukuda, Kumamoto (JP); Mikio Nakashima, Kumamoto (JP); Kazuyoshi Shinohara, Kumamoto (JP); Hiroyuki Higashi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 181 days.

(21) Appl. No.: 15/989,744

(22) Filed: May 25, 2018

(65) Prior Publication Data

US 2018/0350636 A1   Dec. 6, 2018

(30) Foreign Application Priority Data

May 31, 2017   (JP) .............................. JP2017-108689

(51) Int. Cl.
  *H01L 21/67*   (2006.01)

(52) U.S. Cl.
  CPC .... *H01L 21/67023* (2013.01); *H01L 21/6708* (2013.01); *H01L 21/67017* (2013.01); *H01L 21/67051* (2013.01); *H01L 21/67253* (2013.01)

(58) Field of Classification Search
  CPC ......... H01L 21/67023; H01L 21/67017; H01L 21/67051; H01L 21/6708; H01L 21/67253
  USPC ...................................................... 134/56 R
  See application file for complete search history.

(56) References Cited

U.S. PATENT DOCUMENTS

| | | | |
|---|---|---|---|
| 2007/0221615 A1* | 9/2007 | Maeda | B24B 37/04 216/57 |
| 2014/0370199 A1* | 12/2014 | Kishita | H01L 21/6715 427/424 |

FOREIGN PATENT DOCUMENTS

| | | |
|---|---|---|
| JP | 2013030559 | 2/2013 |
| KR | 101761429 B1 * | 7/2017 |

OTHER PUBLICATIONS

KR101761429B1—Machine translation (Year: 2012).*

* cited by examiner

*Primary Examiner* — Tinsae B Ayalew
(74) *Attorney, Agent, or Firm* — Nath, Goldberg & Meyer; Jerald L. Meyer

(57) ABSTRACT

A substrate solution-treatment apparatus includes: a substrate holding part for holding a substrate; a nozzle for supplying a treatment solution onto the substrate; a supply line; a flow rate control mechanism including a flow rate meter and a flow rate control valve installed in the supply line; an opening/closing valve installed in the supply line; and a control part for controlling operations of the flow rate control mechanism and the opening/closing valve. The flow rate control mechanism controls the flow rate control valve such that a detection value of the flow rate meter coincides with a flow rate target value provided from the control part. The control part controls the nozzle to supply the treatment solution onto the substrate with the opening/closing valve opened, and provides a first flow rate as the flow rate target value to the flow rate control mechanism.

8 Claims, 5 Drawing Sheets

SUBSTRATE SOLUTION-TREATMENT APPARATUS, TREATMENT SOLUTION SUPPLYING METHOD AND STORAGE MEDIUM

CROSS-REFERENCE TO RELATED APPLICATION

This application is based upon and claims the benefit of priority from Japanese Patent Application No. 2017-108689, filed on May 31, 2017, the entire contents of which are incorporated herein by reference.

TECHNICAL FIELD

The present disclosure relates to a technique for subjecting a substrate to a solution treatment by supplying a treatment solution from a nozzle to the substrate.

BACKGROUND

A process of manufacturing a semiconductor device includes a solution treatment step of subjecting a substrate such as a semiconductor wafer to a solution treatment such as a wet etching, a chemical cleaning or the like by supplying a treatment solution from a nozzle onto the surface of the substrate. The treatment solution may drop from the nozzle onto the surface of the substrate after stopping the supply of the treatment solution from the nozzle. This causes a treatment failure of the substrate. If the treatment solution drops from the nozzle to an outer region of a solution receiving cup, the dropped treatment solution may crystallize to contaminate the interior of a processing chamber. The problem in which the treatment solution drops from the nozzle even after the supply of the treatment solution is stopped is remarkable in a chemical solution with low surface tension, for example, buffered hydrofluoric acid (BHF) containing a surfactant.

As an example of methods for addressing such a problem, an apparatus has been used which includes a supply line through which a treatment solution is supplied from a treatment solution supply source to a nozzle, a flow rate control mechanism disposed in the supply line, a main opening/closing valve which is disposed at the downstream side of the flow rate control mechanism and is capable of adjusting a valve closing speed, a drain line branched from the supply line at the upstream side of the main opening/closing valve and at the downstream side of the flow rate control mechanism, and an opening/closing valve disposed in the drain line. When the supply of the treatment solution from the nozzle is stopped, the opening/closing valve of the drain line is opened to allow a portion of the treatment solution to flow, which is flowing through the supply line, to the drain line. In this state, the main opening/closing valve is closed at a low valve closing speed. This makes it possible to maintain a primary-side pressure of the main opening/closing valve substantially constant when closing the main opening/closing valve, thereby preventing the solution from being cut off inside the nozzle due to the effect obtained by slowly closing the main opening/closing valve. Therefore, it is possible to prevent the solution from dropping from the nozzle after the supply of the treatment solution is stopped. In addition, it is possible to prevent breakage of components of the flow rate control mechanism due to the rise in internal pressure.

However, the conventional apparatus discards a portion of the treatment solution flowing through the supply line without being supplied onto the substrate at the time the supply of the treatment solution is stopped. This causes problems in that the treatment solution is wastefully consumed and it is impossible to precisely control the total amount of treatment solution to be supplied onto the substrate. Therefore, there is room for improvement in these respects.

SUMMARY

Some embodiments of the present disclosure provide a technique capable of preventing a treatment solution from dropping from a nozzle after stopping discharge of the treatment solution from the nozzle, quantitatively controlling a flow rate of the treatment solution just before closing an opening/closing valve, and reducing a consumption amount of the treatment solution.

According to one embodiment of the present disclosure, there is provided a substrate solution-treatment apparatus including: a substrate holding part configured to hold a substrate; a nozzle configured to supply a treatment solution onto the substrate held by the substrate holding part; a supply line having a first end connected to the nozzle and a second end connected to a treatment solution supply source; a flow rate control mechanism including a flow rate meter and a flow rate control valve installed in the supply line; an opening/closing valve installed in the supply line; and a control part configured to control operations of the flow rate control mechanism and the opening/closing valve, wherein the flow rate control mechanism is configured to control the flow rate control valve such that a detection value of the flow rate meter coincides with a flow rate target value provided from the control part, wherein the control part controls the nozzle to supply the treatment solution onto the substrate with the opening/closing valve opened, and provides a first flow rate as the flow rate target value to the flow rate control mechanism, and wherein, when stopping the supply of the treatment solution from a state where the treatment solution is being supplied from the nozzle to the substrate by switching the opening/closing valve from an opened state to a closed state, the control part performs a stop control of providing a second flow rate smaller than the first flow rate to the flow rate control mechanism as the flow rate target value before the opening/closing valve is switched from the opened state to the closed state.

According to another embodiment of the present disclosure, there is provided a method of supplying a treatment solution from a nozzle onto a substrate in a substrate solution-treatment apparatus which includes a substrate holding part configured to hold the substrate, the nozzle configured to supply the treatment solution onto the substrate held by the substrate holding part, a supply line having a first end connected to the nozzle and a second end connected to a treatment solution supply source, a flow rate control mechanism including a flow rate meter and a flow rate control valve installed in the supply line, and an opening/closing valve installed in the supply line at a downstream side of the flow rate control valve, the flow rate control mechanism being configured to control the flow rate control valve such that a detection value of the flow rate meter coincides with a flow rate target value provided from a control part, the method including: supplying the treatment solution from the nozzle onto the substrate at a first flow rate in a state where the opening/closing valve is opened and the first flow rate is set in the flow rate control mechanism as the flow rate target value; and performing a stop control which includes stopping the supply of the treatment solution from the nozzle from a state where the treatment solution is being supplied from the nozzle onto the substrate at the first flow rate, switching the opening/closing valve from an opened state to a closed state and setting a second flow rate smaller than the first flow rate in the flow rate control mechanism as the flow rate target value before the opening/closing valve is switched from the opened state to the closed state.

According to another embodiment of the present disclosure, there is provided a non-transitory computer-readable storage medium storing a program that causes a computer to control an operation of a substrate solution-treatment apparatus to perform the aforementioned method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
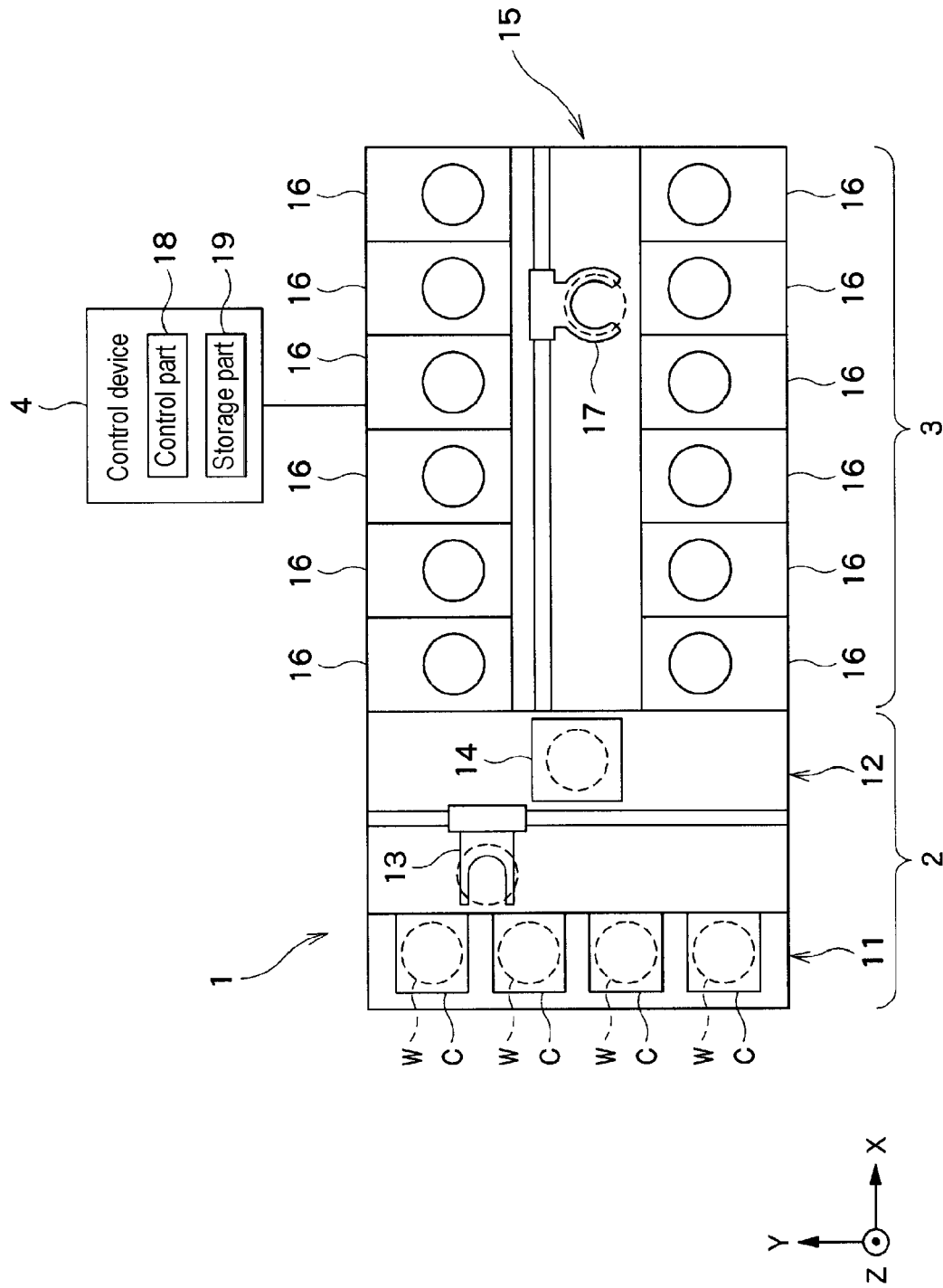
FIG. 1 is a plan view showing a schematic configuration of a substrate processing system according to an embodiment of the present disclosure.

FIG. 1 is a view showing a schematic configuration of a substrate processing system according to an embodiment. For the clarification of a positional relationship, an X-axis, a Y-axis and a Z-axis, which are orthogonal to one another, are defined in the following description and a positive Z-axis direction is defined as a vertical upward direction.

As shown in FIG. 1, a substrate processing system 1 includes a loading/unloading station 2 and a processing station 3. The loading/unloading station 2 and the processing station 3 are disposed adjacent to each other.

The loading/unloading station 2 includes a carrier mounting part 11 and a transfer part 12. A plurality of carriers C in which a plurality of substrates (in this embodiment, a plurality of semiconductor wafers (hereinafter referred to as wafers W)) are accommodated in a horizontal posture and are mounted on the carrier mounting part 11.

The transfer part 12 is disposed adjacent to the carrier mounting part 11 and includes a substrate transfer device 13 and a delivery part 14 provided therein. The substrate transfer device 13 includes a wafer holding mechanism for holding the wafer W. In addition, the substrate transfer device 13 is capable of moving in horizontal and vertical directions and being swung around a vertical axis. The substrate transfer device 13 uses the wafer holding mechanism to transfer the wafer W between the carrier C and the delivery part 14.

The processing station 3 is disposed adjacent to the transfer part 12. The processing station 3 includes a transfer part 15 and a plurality of processing units 16. The plurality of processing units 16 are disposed side by side at both sides of the transfer part 15.

The transfer part 15 includes a substrate transfer device 17 provided therein. The substrate transfer device 17 includes a wafer holding mechanism for holding the wafer W. Further, the substrate transfer device 17 is capable of moving in the horizontal and vertical directions and being swung around a vertical axis. The substrate transfer device 17 uses the wafer holding mechanism to transfer the wafer W between the delivery part 14 and the processing units 16.

Each of the processing units 16 performs a predetermined substrate process on the wafer W transferred by the substrate transfer device 17.

Further, the substrate processing system 1 includes a control device 4. The control device 4 is, for example, a computer, and includes a control part 18 and a storage part 19. A program for controlling various processes executed in the substrate processing system 1 is stored in the storage part 19. The control part 18 controls the operation of the substrate processing system 1 by reading out and executing the program stored in the storage part 19.

Such a program may be recorded in a computer-readable storage medium and may be installed from the storage medium on the storage part 19 of the control device 4. Examples of the computer-readable storage medium may include a hard disk (HD), a flexible disk (FD), a compact disk (CD), a magneto-optical disk (MO), a memory card and the like.

In the substrate processing system 1 configured as above, first, the substrate transfer device 13 of the loading/unloading station 2 takes out a wafer W from a carrier C mounted on the carrier mounting part 11 and mounts the taken-out wafer W on the delivery part 14. The wafer W mounted on the delivery part 14 is picked up by the substrate transfer device 17 of the processing station 3 and is loaded into the processing unit 16.

The wafer W loaded into the processing unit 16 is processed by the processing unit 16. Thereafter, the processed wafer W is unloaded from the processing unit 16 by the substrate transfer device 17, and subsequently, mounted on the delivery part 14. Then, the processed wafer W mounted on the delivery part 14 is returned to the carrier C of the carrier mounting part 11 by the substrate transfer device 13.

Figure 2:
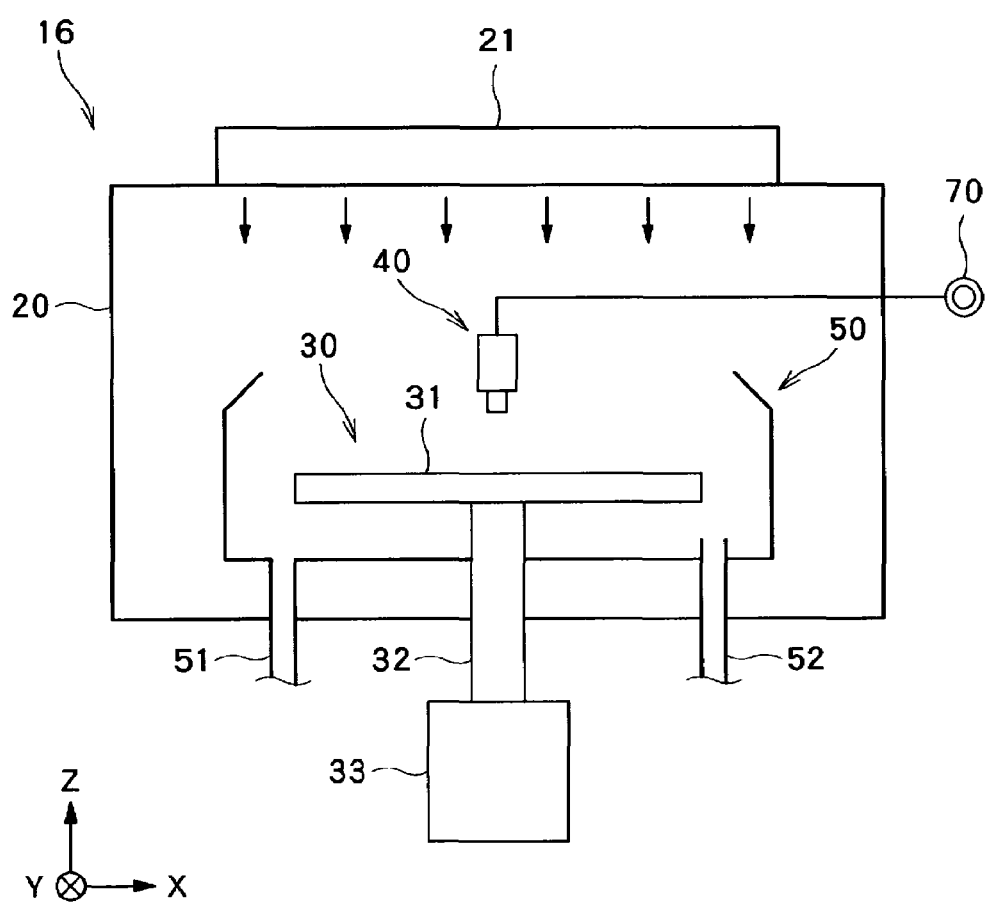
FIG. 2 is a longitudinal sectional view showing a schematic configuration of a processing unit shown in FIG. 1.

As shown in FIG. 2, the processing unit 16 includes a chamber 20, a substrate holding mechanism 30, a treatment fluid supply part 40 as a first treatment fluid supply part and a recovery cup 50.

The chamber 20 accommodates the substrate holding mechanism 30, the treatment fluid supply part 40 and the recovery cup 50. An FFU (Fan Filter Unit) 21 is disposed on a ceiling of the chamber 20. The FFU 21 forms a down-flow inside the chamber 20.

The substrate holding mechanism 30 includes a holding part 31, a column part 32 and a driving part 33. The holding part 31 holds the wafer W in a horizontal posture. The column part 32 is a member extending in the vertical direction, and has a base end portion rotatably supported by the driving part 33 and a leading end portion on which the holding part 31 is horizontally supported. The driving part 33 rotates the column part 32 around the vertical axis. The substrate holding mechanism 30 rotates the support part 31 supported by the column part 32 by rotating the column part 32 using the driving part 33. Thus, the wafer W held by the holding part 31 is rotated.

The treatment fluid supply part 40 supplies a treatment fluid onto the wafer W. The treatment fluid supply part 40 is connected to a treatment fluid supply source 70.

The recovery cup 50 is disposed so as to surround the holding part 31 and collects a treatment solution scattering from the wafer W with the rotation of the holding part 31. A solution drain port 51 is formed in the bottom of the recovery cup 50. The treatment solution collected by the recovery cup 50 is discharged from the processing unit 16 through the solution drain port 51. In addition, an exhaust port 52 is formed in the bottom of the recovery cup 50 to discharge a gas supplied from the FFU 21 outside of the processing unit 16.

Next, a treatment solution supply system including the treatment fluid supply part 40 and the treatment fluid supply source 70 will be described.

The treatment fluid supply source 70 includes at least one treatment solution supply source. In the embodiment shown in FIG. 3, the treatment fluid supply source 70 includes a first treatment solution supply source 71 and a second treatment solution supply source 72. The first treatment solution supply source 71 supplies a buffered hydrofluoric acid (BHF) containing a surfactant as a first treatment solution. The second treatment solution supply source 72 supplies, for example, DIW (pure water) as a second treatment solution.

In one embodiment, although not shown, each of the first and second treatment solution supply sources 71 and 72 includes a tank for supplying a treatment solution, a circulation line connected to the tank, a pump installed in the circulation line for forming a circulating flow that is originated from the tank and returns to the tank through the circulation line, and components such as a heater, a filter and the like provided in the circulation line. The configurations of the first and second treatment solution supply sources 71 and 72 are not limited thereto but any configuration may be adopted as long as it can supply the treatment solution in a pressurized state.

A supply line 711 is connected to the first treatment solution supply source 71 and a supply line 721 is connected to the second treatment solution supply source 72. An opening/closing valve 712 is installed in the supply line 711, and an opening/closing valve 722 is installed in the supply line 721. The supply line 721 is joined with the supply line 711 at a junction 711a.

In the case where each of the first and second treatment solution supply sources 71 and 72 has the tank and the circulation line as described above, the supply line 711 is connected to the circulation line for the first treatment solution and the supply line 721 is connected to the circulation line for the second treatment solution.

The above-described opening/closing valve 712, a flow rate meter 714, a constant-pressure valve 715 and an opening/closing valve 717 (a main body 717a of the opening/closing valve 717) are sequentially installed in the supply line 711 from the upstream side thereof. A downstream end of the supply line 711 is connected to a nozzle serving as the treatment fluid supply part 40 (hereinafter sometimes referred to as a nozzle 40).

In a case where only one kind of treatment solution is configured to be supplied to the nozzle 40, the second treatment solution supply source 72, the supply line 721 and the opening/closing valve 722 may be omitted. In this case, the opening/closing valve 712 of the supply line 711 may also be omitted. That is to say, the opening/closing valve 712 and the opening/closing valve 722 installed at the upstream side of the constant-pressure valve 715 are provided to switch the treatment solution to be supplied to the nozzle 40 and is not directly involved in the supply (discharge) of the treatment solution from the nozzle 40 and the stop of the supply.

At a branch point 711b at the downstream side of the opening/closing valve 717 (i.e., the main body 717a of the opening/closing valve 717), a drain line 718 is branched from the supply line 711. An opening/closing valve 719a and an orifice 719b are installed in the drain line 718. The drain line 718 is used to return the treatment solution existing near a discharge port of the nozzle 40 toward the upstream side of the supply line 711. Thus, after the supply (discharge) of the treatment solution from the nozzle 40 is completed, the treatment solution is prevented from dropping from the nozzle 40 in a more reliable manner.

A flow rate of the treatment solution flowing through the constant-pressure valve 715 can be controlled by supplying an operation port 715a (pilot port) of the constant-pressure valve 715 with an operation pressure PP which is an air pressure precisely controlled by an electro-pneumatic regulator 716 (operation pressure supply part). Specifically, the control device 4 (which may be a lower-level controller of the control device 4) calculates a deviation between a flow rate target value prescribed in the process recipe and a detection value of the flow rate meter 714, and performs a feedback control calculation based on the deviation to obtain the operation pressure PP required to achieve a secondary pressure of the constant-pressure valve 715 which is required to obtain the flow rate target value. Then, the control device 4 transmits a control signal instructing the supply of the obtained operation pressure PP to the operation port 715a, to the electro-pneumatic regulator 716. In this manner, the flow rate of the treatment solution supplied from the nozzle 40 onto the wafer W via the supply line 711 is controlled to have a desired value. That is to say, in the present embodiment, the constant-pressure valve 715 is used as a flow rate control valve. A combination of the flow rate meter 714, the constant-pressure valve 715 and the electro-pneumatic regulator 716 constitute a flow rate control mechanism 713.

While the constant-pressure valve 715 may be used as a flow rate control valve of the flow rate control mechanism 713, other types of valves, for example, a needle valve, may be used instead of the constant-pressure valve 715. The type of the flow control valve of the flow rate control mechanism 713 is not particularly limited as long as it can perform the feedback control with a response sufficient to allow the detection value of the flow rate meter 714 to coincide with the flow rate target value, The opening/closing valve 717 is configured as an air-operated valve capable of adjusting a valve closing speed. The opening/closing valve 717 includes the main body (or an opening/closing valve main body) 717a. A valve body of the opening/closing valve main body 717a is spring-biased in a closing direction. An operation port 717b of the opening/closing valve main body 717a is connected to a compressed-air supply source 717d via an operation pressure line 717c. A solenoid valve (SV) 717e and a valve unit 717f are installed in the operation pressure line 717c. The valve unit 717f incorporates a variable throttle valve 717g and a check valve 717h arranged in parallel.

When the solenoid valve 717e is opened, the compressed-air is supplied to the opening/closing valve main body 717a through mainly the check valve 717h of the valve unit 717f, thereby opening the valve body of the opening/closing valve main body 717a. When the solenoid valve 717e is closed, the valve body of the opening/closing valve main body 717a tries to return to a closed position by virtue of a spring force. At this time, the air discharged from the opening/closing valve main body 717a cannot pass through the check valve 717h but passes through only the variable throttle valve 717g. Therefore, by decreasing (increasing) the opening degree of the variable throttle valve 717g, the valve closing speed of the opening/closing valve main body 717a can be decreased (increased).

The processing unit 16 is further provided with a two-fluid nozzle 40A serving as a second treatment fluid supply part. Pure water (DIW) is supplied from a pure water supply source 73a to the two-fluid nozzle 40A via a pure water supply line 73c in which a flow rate control device 73b including an opening/closing valve, a flow rate control valve and the like are installed. A nitrogen gas is supplied from a nitrogen gas supply source 74a to the two-fluid nozzle 40A via a gas supply line 74c in which a flow rate control device 74b including an opening/closing valve, a flow rate control valve and the like are installed. In the interior of the two-fluid nozzle 40A, the pure water is mixed with the nitrogen gas so that the pure water is brought into a mist state. A mixture fluid (two-fluid) of the misted pure water and the nitrogen gas is supplied (discharged) from the two-fluid nozzle 40A.

The processing unit 16 is further provided with a fixed nozzle 40B serving as a third treatment fluid supply part. The fixed nozzle 40B is fixed to an upper portion of the recovery cup 50. Pure water (DIW) is supplied from a pure water supply source 75a to the fixed nozzle 40B via a pure water supply line 75c in which a flow rate control device 75b including an opening/closing valve, a flow rate control valve and the like are installed. The pure water supplied to the fixed nozzle 40B is discharged horizontally or obliquely upward so as to reach the central portion of the wafer W held by the holding part 31.

The nozzle 40 and the two-fluid nozzle 40A may be held by a common nozzle arm or individual nozzle arms. In either case, the nozzle 40 and the two-fluid nozzle 40A can move between a process position defined above the wafer W and a standby position defined outside the recovery cup 50.

The pure water (DIW) supplied from the fixed nozzle 40B may contain a very small amount of ammonia. That is to say, functional water may be supplied from the fixed nozzle 40B.

Next, a solution treatment of the wafer W executed by the processing unit 16 will be described. In an example described below, it is assumed that a treatment solution is supplied from the first treatment solution supply source 71 to the nozzle 40. Therefore, while the solution treatment is being performed on a single wafer W, the opening/closing valve 712 is kept opened all the time and the opening/closing valve 722 is kept closed all the time. These opening/closing valves 712 and 722 will not be mentioned later.

The wafer W is loaded into the processing unit 16 by the substrate transfer device 17 and is held in a horizontal posture by the substrate holding mechanism 30. Thereafter, the wafer W is rotated around the vertical axis by the substrate holding mechanism 30. The wafer W is continuously rotated until the processing of the wafer W is completed. In this state, the nozzle 40 is positioned immediately above the central portion of the wafer W and the opening/closing valve 717 (the opening/closing valve main body 717a) is opened to supply BHF containing a surfactant ((hereinafter simply referred to as "BHF" for the sake of simplicity of description) from the nozzle 40 onto the wafer W at a flow rate controlled by the flow rate control mechanism 713. As a result, a predetermined solution treatment (etching treatment) is performed on the wafer W.

Thereafter, the opening/closing valve 717 (the opening/closing valve main body 717a) is closed and the nozzle 40 is withdrawn and moved backward from immediately above the central portion of the wafer W. An operation at the time of closing the opening/closing valve 717 will be described in detail later.

Subsequently, the functional water (DIW containing a very small amount of ammonia) is supplied from the fixed nozzle 40B onto the central portion of the wafer W. Further, the two-fluid nozzle 40A is located immediately above the central portion of the wafer W. The mixture fluid (two-fluid) of the misted pure water (DIW) and the nitrogen gas is sprayed from the two-fluid nozzle 40A toward the central portion of the wafer W. Thereafter, while discharging the two-fluids, the two-fluid nozzle 40A moves toward a position immediately above the peripheral portion of the rotating wafer W. Thus, a two-fluid-based cleaning process is performed over the entire surface of the wafer W. In the two-fluid-based cleaning process, reaction products and the like adhering to the surface of the wafer W in the preceding process are efficiently removed due to a high physical energy of the two-fluids.

By supplying the two-fluids from the two-fluid nozzle 40A, it is possible to efficiently remove particles adhering to the wafer W. However, a thickness of a solution film formed on the wafer W tends to become smaller than that in the ordinary cleaning. If the solution film is thin, the particles removed from the wafer W are likely to re-adhere to the wafer W at the outer peripheral portion of the wafer W. However, in the present embodiment, since the treatment fluid is also supplied from the fixed nozzle 40B onto the wafer W, a solution film having a sufficient thickness is formed on the surface of the wafer W. In addition, since the functional water (DIW containing a very small amount of ammonia) is used as the treatment solution, both the potential of the surface of the wafer W and the potential of the particles are negative thereby repelling each other. Thus, the particles removed from the wafer W are prevented from re-adhering to the wafer W in a more reliable manner.

Once the two-fluid nozzle 40A moves to a position immediately above the peripheral portion of the wafer W, the two-fluid nozzle 40A is returned to a position immediately above the central portion of the wafer W and is fixed at the respective position. Subsequently, while continuing the supply of the pure water to the two-fluid nozzle 40A, the supply of the nitrogen gas is stopped. Thus, the pure water (which is not in the mist state) is supplied from the two-fluid nozzle 40A to the central portion of the wafer W so that the wafer W is subjected to a rinse treatment. When the supply of the nitrogen gas to the two-fluid nozzle 40A is stopped, the discharge of the functional water from the fixed nozzle 40B may be stopped.

Upon completing the rinsing treatment, the supply of the pure water from the two-fluid nozzle 40A (and the fixed nozzle 40B) is stopped. The number of rotations of the wafer W may be increased to perform a shaking-off drying treatment. In this way, a series of solution treatment for the single wafer W is completed. The wafer W subjected to the solution treatment is unloaded from the processing unit 16.

Next, the supply control from the start of the supply of the treatment solution (i.e., BHF containing a surfactant) from the nozzle 40 to the end of the supply of the treatment solution in the above-described etching treatment will be described with reference to FIG. 4. The following control operation is performed by the control device 4 configured to control the components of the substrate processing system 1 based on the process recipe stored in the storage part 19.

First, in the standby state of the supply of the treatment solution from the nozzle 40, the opening/closing valve 717 (the opening/closing valve main body 717a) is closed, and based on an instruction provided from the control device 4, the operation pressure PP of, e.g., 50 kPa as an initial operation pressure is applied from the electro-pneumatic regulator 716 to the operation port 715a of the constant-pressure valve 715. At time T1, the control device 4 transmits a control signal to start the supply (discharge) of the treatment solution from the nozzle 40. Specifically, the control device 4 transmits a control signal for opening the solenoid valve 717e. When the solenoid valve 717e is opened, the opening/closing valve main body 717a is opened to allow the treatment solution flow to the supply line 711.

The control device 4 calculates a deviation between the detection value of the flow rate meter 714 and the flow rate target value (e.g., a first flow rate) and performs the feedback control calculation based on the deviation to obtain the operation pressure PP required to achieve the flow rate target value. Thereafter, the control device 4 transmits a control signal for causing the electro-pneumatic regulator 716 to supply the obtained operation pressure PP to the constant-pressure valve 715. Thus, the treatment solution is supplied from the nozzle 40 onto the wafer W at a controlled flow rate (e.g., the first flow rate).

Figure 4:
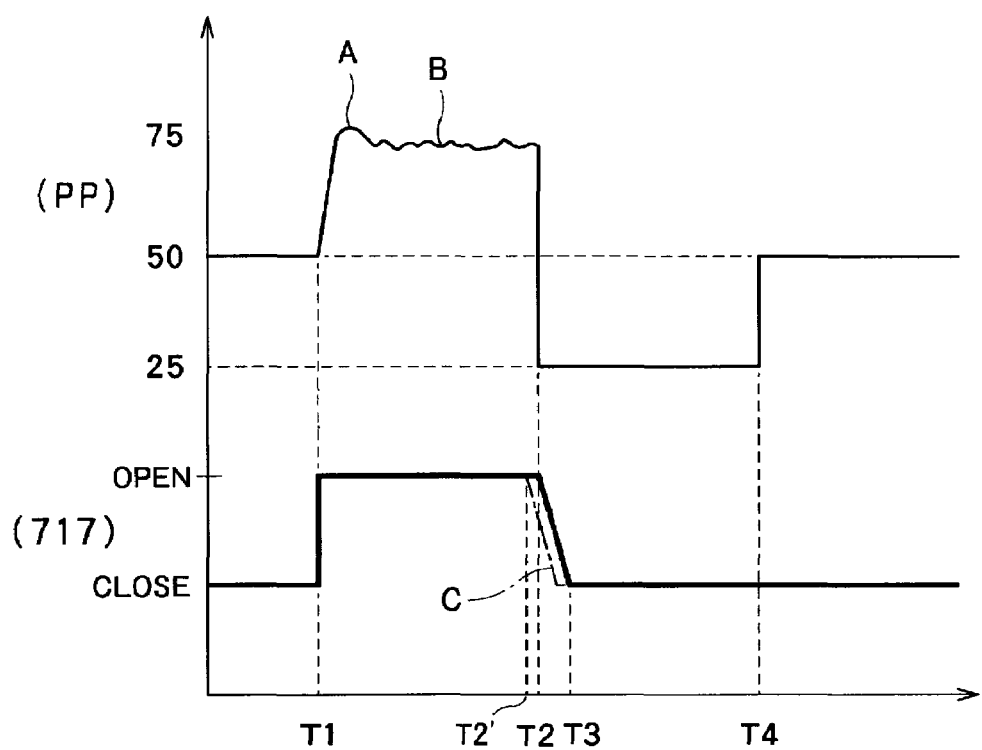
FIG. 4 is a time chart for explaining control of discharge of a treatment solution from a nozzle.

The operation pressure PP at which the feedback control is stably performed is assumed to slightly fluctuate around 75 kPa (see a portion indicated by symbol B in a graph of FIG. 4). The initial operation pressure PP is set to an appropriately small value (which is a fixed value) with respect to about 75 kPa which is the operation pressure PP at the time of stable control. As a result, immediately after the start of the feedback control, control instability of a problematic level (for example, increase in an overshoot indicated by symbol A in the graph of FIG. 4) does not occur (which may occur when the initial operation pressure PP is increased too much). Further, a period of time required to stabilize the flow rate to the flow rate target value does not become too long (which may occur when the initial operation pressure PP is decreased too much).

At time T2 after a predetermined period of time from time T1, the control device 4 transmits a control signal for stopping the supply (discharge) of the treatment solution from the nozzle 40. Time T2 is not limited after the predetermined period of time from time T1, but may be a time point at which an integration of the detection value of the flow rate meter 714 (namely, the total amount of the treatment solution discharged from the nozzle 40) becomes a predetermined value.

The control signal transmitted from the control device 4 in order to stop the supply (discharge) of the treatment solution from the nozzle 40 at time T2 includes a first control signal for providing, as the flow rate target value, a second flow rate smaller than the first flow rate to the flow rate control mechanism 713, and a second control signal for switching the opening/closing valve 717 from an opened state to a closed state. Specifically, at time T2, the control device 4 transmits to the electro-pneumatic regulator 716 a control signal (the first control signal) for lowering the operation pressure PP to be supplied to the constant-pressure valve 715 to a supply stop-purpose operation pressure (e.g., 25 kPa) which is smaller than the operation pressure PP of about 75 kPa when the treatment solution stably flows to the supply line 711 at the first flow rate and is smaller than the initial operation pressure PP of 50 kPa. As a result, the opening degree of the constant-pressure valve 715 decreases to reduce the flow rate of the treatment solution flowing through the supply line 711 from the first flow rate to the second flow rate (which is smaller than the first flow rate) (in a case where the opening/closing valve 717 (the opening/closing valve main body 717a) is kept opened). At time T2, in order to close the opening/closing valve 717 (the opening/closing valve main body 717a) at a controlled valve closing speed, the control device 4 transmits a control signal to reduce the opening degree of the variable throttle valve 717g to a predetermined value and a control signal (the second control signal) for closing the solenoid valve 717e.

The variable throttle valve 717g may be throttled before time T2. Further, if there is no need to change the valve closing speed of the opening/closing valve main body 717a (for example, if the opening/closing valve main body 717a is permitted to be constantly closed at the same low speed), a fixed throttle valve (orifice) may be replaced for the variable throttle valve 717g.

According to the above-described operation, the opening/closing valve 717 (the opening/closing valve main body 717a) is closed in a state in which the flow rate of the treatment solution flowing through the supply line 711 decreases. Therefore, the flow of the treatment solution is stopped (time T3) in a state where the flow rate (i.e., the flow velocity) of the treatment solution supplied (discharged) from the nozzle 40 is relatively low. Therefore, even when a treatment solution with low surface tension such as the surfactant-containing BHF is used, the inertial force acting on the tip portion of the treatment solution inside the nozzle 40 is prevented from exceeding the surface tension for preventing the tip portion from being cut off. This makes it possible to prevent the solution from being cut off inside the nozzle 40 and ultimately, prevent the solution from dropping from the nozzle 40.

In addition, since the opening/closing valve 717 (the opening/closing valve main body 717a) is slowly closed, the cutoff of the solution inside the nozzle 40 is more unlikely to occur than a case where the opening/closing valve 717 is abruptly closed.

Figure 5:
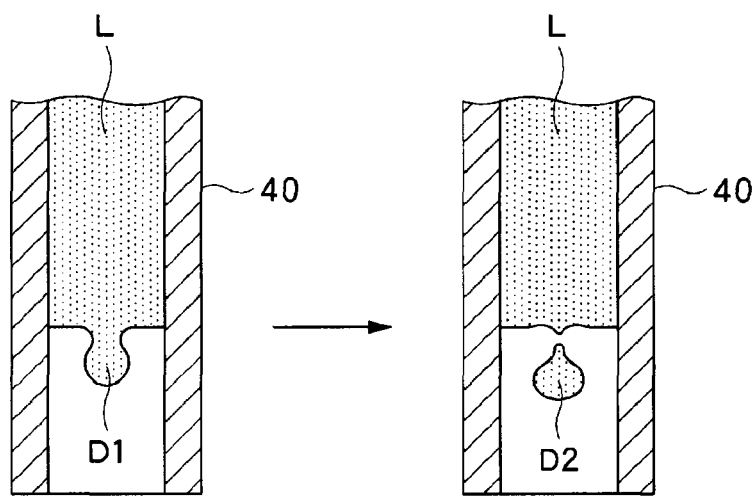
FIG. 5 is a schematic view for explaining flowing out of solution inside a nozzle.

FIG. 5 is a view schematically showing the cutoff of the solution inside the nozzle 40 which may occur when the opening/closing valve 717 is closed without performing the control to lower the operation pressure PP at time T2. When the supply of the treatment solution L is abruptly stopped inside the nozzle 40, a bulging portion D1 occurs due to the inertial force acting on the tip portion of the treatment solution L. When the surface tension acting on the root of the bulging portion D1 is large, the bulging portion D1 is drawn back to the treatment solution L by the surface tension, but when the surface tension is small, the bulging portion D1 is separated due to the inertial force, forming a droplet D2. Therefore, when the surface tension of the treatment solution is small (for example, when the treatment solution is a surfactant-containing BHF), in order to make the inertial force as small as possible, the opening/closing valve 717 (the opening/closing valve main body 717a) may be closed in a state where the flow rate (flow velocity) of the treatment solution flowing into the nozzle 40 is decreased. As a result, even when the bulging portion D1 occurs, the bulging portion D1 is drawn back to the treatment solution L due to the surface tension, thus preventing the droplet D2 from being formed.

After time T3 at which the supply (discharge) of the treatment solution from the nozzle 40 is stopped, the operation pressure PP is raised to the above-described initial operation pressure (50 kPa in this example) at time T4. Time T4 may be an arbitrary time point before time T1 at which the discharge of the treatment solution onto a subsequent wafer W to be processed is started.

After the opening/closing valve 717 (the opening/closing valve main body 717a) is completely closed, an operation of drawing back the treatment solution existing inside the nozzle 40 to the upstream side may be performed. That is to say, when the opening/closing valve 719a of the drain line 718 is opened in a state where the opening/closing valve 717 is closed, the treatment solution existing in the drain line 718 is dropped downward under the force of gravity. Along with this, according to the principle of Siphoning, the treatment solution existing in the supply line 711 inside or near the nozzle 40 is drawn into a region at the upstream side of the supply line 711. This makes it possible to keep the nozzle 40 clear of the treatment solution, thereby more reliably preventing the solution from dripping from the nozzle 40. In order to facilitate the above-described operation, height positions of the opening/closing valve 719a and a downstream end of the drain line 718 are set to be lower than a height position of the nozzle 40. With this operation, when two or more kinds of treatment solutions are supplied to the supply line 711, it is also possible to prevent the first treatment solution from being supplied from the nozzle 40 at the beginning of the supply of the second treatment solution.

According to the above embodiment, when the supply of the treatment solution from the nozzle 40 is stopped, it is possible to prevent the cutoff of the solution inside the nozzle 40, thereby preventing the solution from dripping from the nozzle 40. Further, in the above embodiment, when the supply of the treatment solution from the nozzle 40 is stopped, since there is no need to discard the treatment solution without supplying the treatment solution onto the wafer W, the utilization efficiency of the treatment solution can be improved. Further, it is possible to precisely manage the total amount of the treatment solution to be supplied onto the wafer W.

The above embodiment can be modified as follows.

Figure 3:
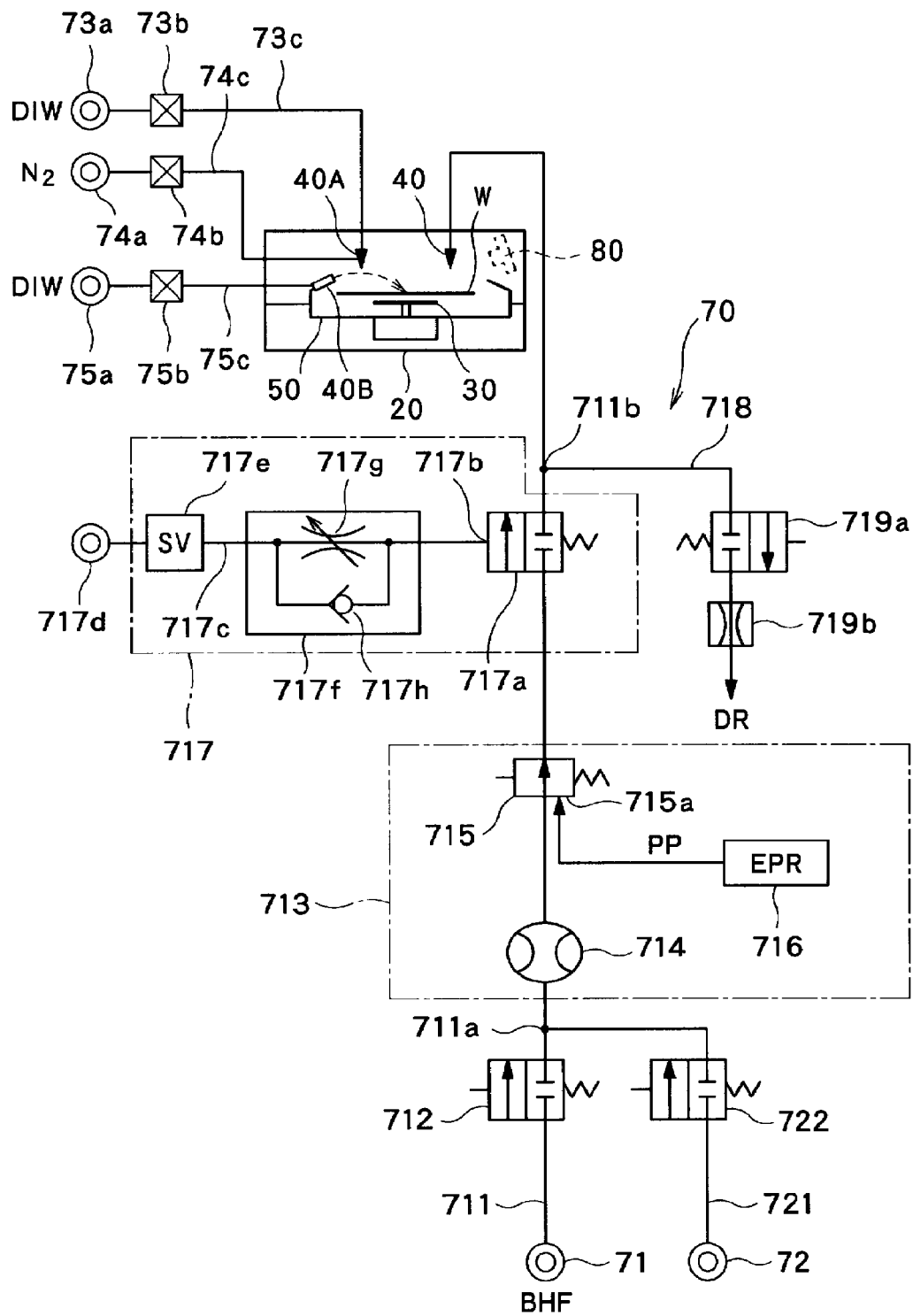
FIG. 3 is a piping system diagram showing specific configurations of a treatment fluid supply part and a treatment fluid supply source shown in FIG. 2.

As indicated by a broken line in FIG. 3, a camera 80 for photographing the vicinity of the discharge port of the nozzle 40 may be installed. Only when it is confirmed by an image taken by the camera 80 that the solution dripping occurs at the time of stopping the supply of the treatment solution, the above-described stop control (of reducing the operation pressure PP of the constant-pressure valve 715 to the supply stop-purpose operation pressure) may be performed. That is to say, it may be determined based on the image taken by the camera whether to perform the above-described stop control. Further, when it is confirmed by the camera image that the solution dripping occurs at a certain supply stop-purpose operation pressure (corresponding to the second flow rate), the supply stop-purpose operation pressure may be further decreased. In other words, the supply stop-purpose operation pressure (the second flow rate) may be determined or changed based on the camera image.

The control device 4 may include a database in which the presence or absence of necessity of performing the above-described stop control and values of the supply stop-purpose operation pressure (or the second flow rate) to be used for the stop control are recorded for each type of treatment solution. The database may be stored in the storage part 19 of the control device 4. Such a database may be created based on experimental results. In a case where the treatment solution is actually supplied onto the wafer W, the control device 4 refers to the database to determine whether to perform the stop control. If it is determined that the stop control is required to be performed, the control device 4 may be configured to determine a value of the supply stop-purpose operation pressure (the second flow rate).

While in the above embodiment, at time T2, the decrease in the operation pressure PP of the constant-pressure valve 715 and the start of the closing of the opening/closing valve 717 are performed at the same time, the decrease in the operation pressure PP of the constant-pressure valve 715 may be started at time T2' which is slightly earlier than time T2 (see a chain line C which falls downward from time T2' before time T2 in FIG. 4). In this case, immediately before transmitting to the opening/closing valve 717 a control signal (the aforementioned second control signal) for switching the opening/closing valve 717 from the opened state to the closed state, the control device 4 transmits to the electro-pneumatic regulator 716 a control signal (the aforementioned first control signal) for lowering the operation pressure PP supplied to the constant-pressure valve 715 to the supply stop-purpose operation pressure. In the above embodiment, by slowly closing the opening/closing valve 717, the total amount of the treatment solution to be supplied from the nozzle 40 tends to be slightly larger than an intended value. However, by slightly advancing the timing of lowering the operation pressure PP of the constant-pressure valve 715, it is possible to eliminate an increase in the total supply amount of the treatment solution, which is caused due to the slow closing of the opening/closing valve 717.

While in the above embodiment, the constant-pressure valve 715 as a flow rate control valve has been described to be installed at the upstream side of the opening/closing valve 717, the constant-pressure valve 715 may be installed at the downstream side of the opening/closing valve 717. Even in this case, the same effects can be achieved by performing the same stop control as above.

The substrate to be processed is not limited to a semiconductor wafer W but may be of another type of substrate such as a glass substrate, a ceramic substrate or the like.

According to the present disclosure in some embodiments, when switching an opening/closing valve from an opened state to a closed state, a flow rate (flow velocity) of a treatment solution passing through a nozzle can be decreased by a flow rate control mechanism in which a second flow rate is set to a flow rate target value. Thus, the inertial force acting on a tip portion of the treatment solution inside the nozzle is prevented from exceeding the surface tension for preventing the tip portion from being cut off. This makes it possible to prevent the solution from being cut off inside the nozzle 40, ultimately prevent the solution from dripping from the nozzle.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate solution-treatment apparatus comprising:
a substrate holding part configured to hold a substrate;
a nozzle configured to supply a treatment solution onto the substrate held by the substrate holding part;
a supply line having a first end connected to the nozzle and a second end connected to a treatment solution supply source;
a flow rate control mechanism including a flow rate meter and a flow rate control valve installed in the supply line;
an opening/closing valve installed in the supply line; and
a control part configured to control operations of the flow rate control mechanism and the opening/closing valve,
wherein the flow rate control mechanism is configured to control the flow rate control valve such that a detection value of the flow rate meter coincides with a flow rate target value provided from the control part,
wherein the control part controls the nozzle to supply the treatment solution onto the substrate with the opening/closing valve opened, and provides a first flow rate as the flow rate target value to the flow rate control mechanism,
wherein, when stopping the supply of the treatment solution from a state where the treatment solution is being supplied from the nozzle to the substrate by switching the opening/closing valve from an opened state to a closed state, the control part performs a stop control of providing a second flow rate smaller than the first flow rate to the flow rate control mechanism as the flow rate target value before the opening/closing valve is switched from the opened state to the closed state,
wherein the flow rate control valve is a constant-pressure valve having an operation port provided therein,
a secondary-side pressure of the constant-pressure valve is changed according to an air pressure applied to the operation port,
the flow rate control mechanism further includes an electro-pneumatic regulator configured to provide an operation air pressure to the operation port of the constant-pressure valve, and
the control part controls the electro-pneumatic regulator to supply the operation air pressure corresponding to the flow rate target value to the constant-pressure valve, and
wherein the operation air pressure provided for forming the second flow rate is smaller than the operation air pressure provided in a standby state of the supply of the treatment solution.

2. The substrate solution-treatment apparatus of claim 1, wherein, in the stop control, the control part transmits to the opening/closing valve a first control signal for switching the opening/closing valve from the opened state to the closed state and simultaneously, transmits to the flow rate control mechanism a second control signal for providing the second flow rate to the flow rate control mechanism as the flow rate target value.

3. The substrate solution-treatment apparatus of claim 1, wherein, in the stop control, the control part transmits to the flow rate control mechanism a third control signal for providing the second flow rate to the flow rate control mechanism as the flow rate target value immediately before transmitting a fourth control signal to the flow rate control mechanism for switching the opening/closing valve from the opened state to the closed state.

4. The substrate solution-treatment apparatus of claim 1, wherein the opening/closing valve includes a mechanism configured to decrease a valve closing speed.

5. The substrate solution-treatment apparatus of claim 1, further comprising:
a camera configured to photograph the nozzle,
wherein, based on a state in which the treatment solution drops from the nozzle, which is grasped from an image of the nozzle previously photographed by the camera immediately after stopping the supply of the treatment solution from the nozzle, the control part performs at least one of determining the presence or absence of necessity of performing the stop control, determining and changing the second flow rate in the stop control.

6. The substrate solution-treatment apparatus of claim 1, wherein the control part includes a database in which the presence or absence of necessity of performing the stop control and values of the second flow rate to be used for the stop control are recorded for each type of treatment solution, and the control part refers to the database to determine whether to perform the stop control and determine a value of the second flow rate when the stop control is performed.

7. A method of supplying a treatment solution from a nozzle onto a substrate in a substrate solution-treatment apparatus which includes a substrate holding part configured to hold the substrate, the nozzle configured to supply the treatment solution onto the substrate held by the substrate holding part, a supply line having a first end connected to the nozzle and a second end connected to a treatment solution supply source, a flow rate control mechanism including a flow rate meter and a flow rate control valve installed in the supply line, and an opening/closing valve installed in the supply line at a downstream side of the flow rate control valve, the flow rate control mechanism being configured to control the flow rate control valve such that a detection value of the flow rate meter coincides with a flow rate target value provided from a control part, the method comprising:
supplying the treatment solution from the nozzle onto the substrate at a first flow rate in a state where the opening/closing valve is opened and the first flow rate is set in the flow rate control mechanism as the flow rate target value; and
performing a stop control which includes stopping the supply of the treatment solution from the nozzle from a state where the treatment solution is being supplied from the nozzle onto the substrate at the first flow rate, switching the opening/closing valve from an opened state to a closed state and setting a second flow rate smaller than the first flow rate in the flow rate control mechanism as the flow rate target value before the opening/closing valve is switched from the opened state to the closed state,
wherein the flow rate control valve is a constant-pressure valve having an operation port provided therein,
a secondary-side pressure of the constant-pressure valve is changed according to an air pressure applied to the operation port,
the flow rate control mechanism further includes an electro-pneumatic regulator configured to provide an operation air pressure to the operation port of the constant-pressure valve, and
the electro-pneumatic regulator supplies the operation air pressure corresponding to the flow rate target value to the constant-pressure valve, and wherein the operation air pressure provided for forming the second flow rate is smaller than the operation air pressure provided in a standby state of the supply of the treatment solution.

8. A non-transitory computer-readable storage medium storing a program that causes a computer to control an operation of a substrate solution-treatment apparatus to perform the method of claim 7.

* * * * *